(12) United States Patent
Hwang

(10) Patent No.: US 12,463,179 B2
(45) Date of Patent: Nov. 4, 2025

(54) SEMICONDUCTOR PACKAGE AND METHOD FOR FABRICATING THE SAME

(71) Applicant: SAMSUNG ELECTRONICS CO., LTD., Suwon-si (KR)

(72) Inventor: Won Hee Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 287 days.

(21) Appl. No.: 18/303,360

(22) Filed: Apr. 19, 2023

(65) Prior Publication Data

US 2023/0387080 A1 Nov. 30, 2023

(30) Foreign Application Priority Data

May 31, 2022 (KR) .................. 10-2022-0067000

(51) Int. Cl.
*H01L 25/065* (2023.01)
*H01L 21/56* (2006.01)
*H01L 25/00* (2006.01)

(52) U.S. Cl.
CPC .......... *H01L 25/0657* (2013.01); *H01L 21/56* (2013.01); *H01L 25/50* (2013.01); *H01L 2225/06562* (2013.01)

(58) Field of Classification Search
CPC ....... H01L 25/0657; H01L 2225/06562; H01L 21/56; H01L 25/50
See application file for complete search history.

(56) References Cited

U.S. PATENT DOCUMENTS

| | | | |
|---|---|---|---|
| 8,242,607 B2 * | 8/2012 | Chin ................... | H01L 25/0657 438/109 |
| 8,956,917 B2 | 2/2015 | Kurosawa et al. | |
| 9,589,933 B2 | 3/2017 | Yu et al. | |
| 9,892,986 B2 | 2/2018 | Koshimizu et al. | |
| 2013/0093103 A1 * | 4/2013 | Kim .................... | H01L 25/0657 257/777 |
| 2015/0061157 A1 * | 3/2015 | Yu ........................... | H01L 25/50 257/777 |
| 2021/0233873 A1 | 7/2021 | Ito et al. | |
| 2022/0013401 A1 | 1/2022 | Wirz et al. | |
| 2022/0037215 A1 | 2/2022 | Baek et al. | |
| 2022/0059473 A1 | 2/2022 | Park | |

FOREIGN PATENT DOCUMENTS

KR 20210099721 A 8/2021

* cited by examiner

*Primary Examiner* — Changhyun Yi
(74) *Attorney, Agent, or Firm* — Wolf, Greenfield & Sacks, P.C.

(57) ABSTRACT

A semiconductor package is provided. The semiconductor package includes a substrate; a plurality of first semiconductor chips on the substrate and spaced apart from each other in a first direction; a plurality of second semiconductor chips on the plurality of first semiconductor chips; a spacer between an uppermost one of the plurality of first semiconductor chips and a lowermost one of the plurality of second semiconductor chips, a plurality of trenches extending in the first direction; and a mold layer within the plurality of trenches.

20 Claims, 18 Drawing Sheets

1200

SEMICONDUCTOR PACKAGE AND METHOD FOR FABRICATING THE SAME

CROSS-REFERENCE TO RELATED APPLICATION

This application claims priority from Korean Patent Application No. 10-2022-0067000 filed on May 31, 2022 in the Korean Intellectual Property Office, and all the benefits accruing therefrom under 35 U.S.C. 119, and the entire contents of the above-identified application are herein incorporated by reference.

BACKGROUND

1. Technical Field

The present disclosure relates to a semiconductor package and a method for fabricating the same.

2. Description of the Related Art

Recently, according to the trend of miniaturization and weight reduction of electronic components, there is also a need for a decrease in the size of semiconductor packages mounted therein. While the area of the package is limited, the size and number of semiconductor chips to be mounted inside the package have been increasing. Accordingly, it may be necessary to efficiently arrange the semiconductor chips within a limited package area.

When a chip stack in which a plurality of semiconductor chips are stacked is disposed, there may be a problem in that an interface peeling phenomenon between a lower chip stack and an epoxy molding compound (EMC) layer may occur in a region between the lower chip stack and upper chip stack.

SUMMARY

Technical aspects to be achieved through one embodiment by the present disclosure provide a semiconductor package with improved reliability in forming a chip stack in which a plurality of semiconductor chips are stacked.

Technical aspects to be achieved through one embodiment by the present disclosure provide a method for fabricating a semiconductor package with improved reliability in forming a chip stack in which a plurality of semiconductor chips are stacked.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

A semiconductor package according to one aspect of the present disclosure to achieve the technical objective includes: a substrate; a plurality of first semiconductor chips on the substrate and spaced apart from each other in a first direction; a plurality of second semiconductor chips on the plurality of first semiconductor chips; a spacer between an uppermost one of the first plurality of semiconductor chips and a lowermost one of the plurality of second semiconductor chips, the spacer including a plurality of trenches extending in the first direction; and a mold layer within the plurality of trenches.

A semiconductor package according to another aspect of the present disclosure to achieve the technical objective includes: a substrate; a plurality of first semiconductor chip stacks on the substrate and spaced apart from each other in a first direction, a second semiconductor chip stack on the plurality of first semiconductor chip stacks; a spacer between the first semiconductor chip stacks and the second semiconductor chip stack, the spacer including a trench; and a mold layer on the first semiconductor chip stacks, the second semiconductor chip stack, and the spacer. The trench includes a first trench and a second trench.

A method for fabricating the semiconductor package according to one aspect of the present disclosure to achieve the other technical objective includes: forming a plurality of first semiconductor chip stacks on a substrate in spaced apart arrangement; stacking a spacer on the plurality of first semiconductor chip stacks; forming a second semiconductor chip stack on a first region of the spacer; forming a mold layer on the plurality of first semiconductor ship stacks, the second semiconductor chip stack, and the spacer; and forming a trench in a second region of the spacer. The mold layer is within the trench.

Details of other embodiments are included in the detailed description and the drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, embodiments of the present disclosure will be described with reference to the attached drawings. The same reference numbers will be used throughout the drawings to refer to the same or like parts, and redundant descriptions thereof are omitted.

Hereinafter, a semiconductor package according to some embodiments of the present disclosure will be described with reference to FIGS. 1 to 7.

Figure 1:
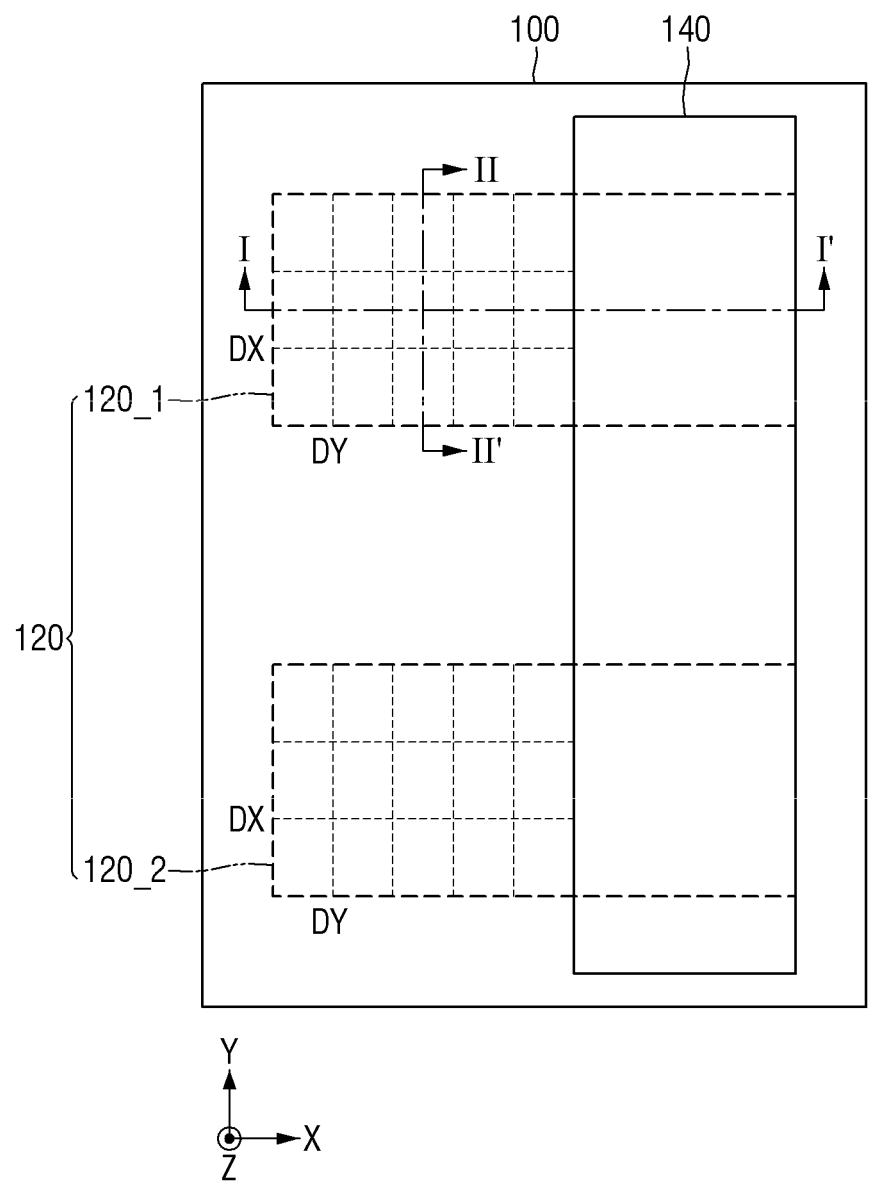
FIG. 1 is a top plan view illustrating a semiconductor package according to some embodiments of the present disclosure.
Figure 2:
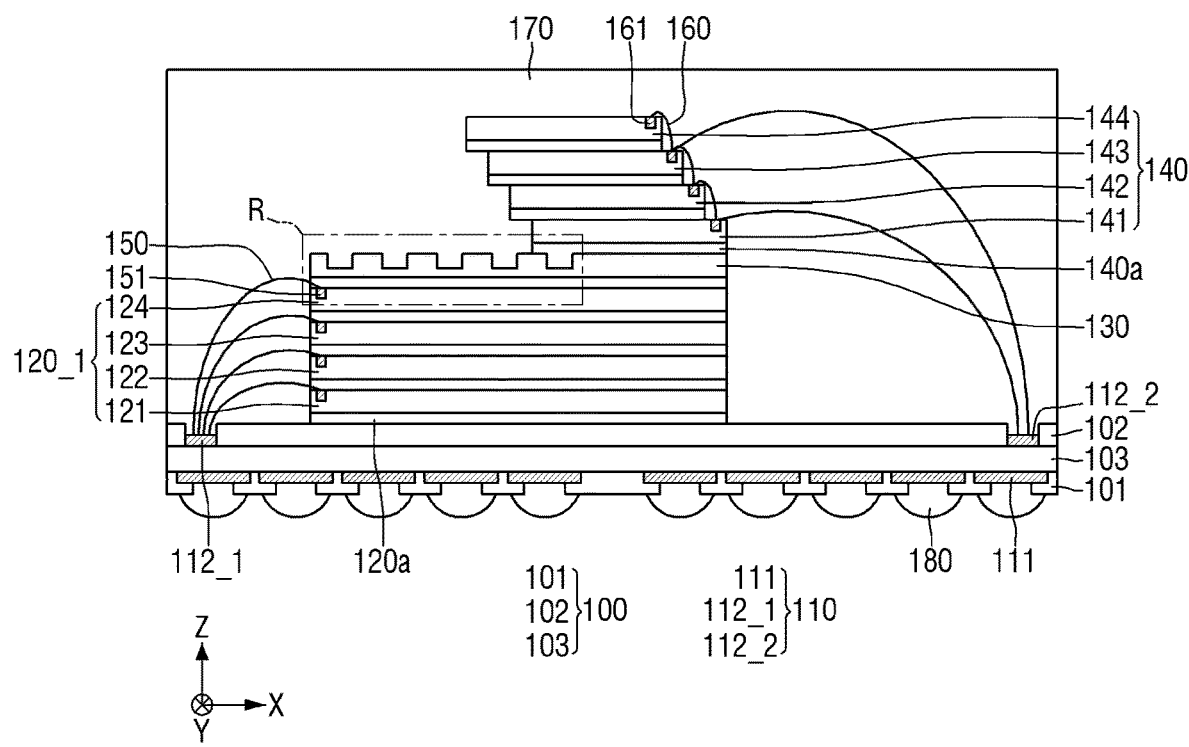
FIG. 2 is a cross-sectional view taken along line I-I' in FIG. 1.
Figure 3:
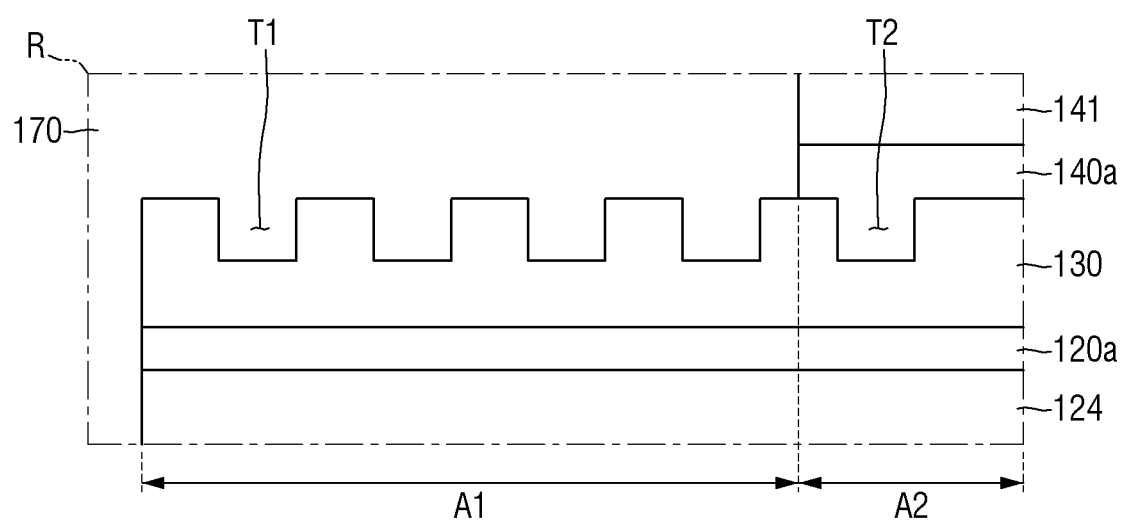
FIG. 3 is an enlarged diagram of a region R in FIG. 2.
Figure 4:
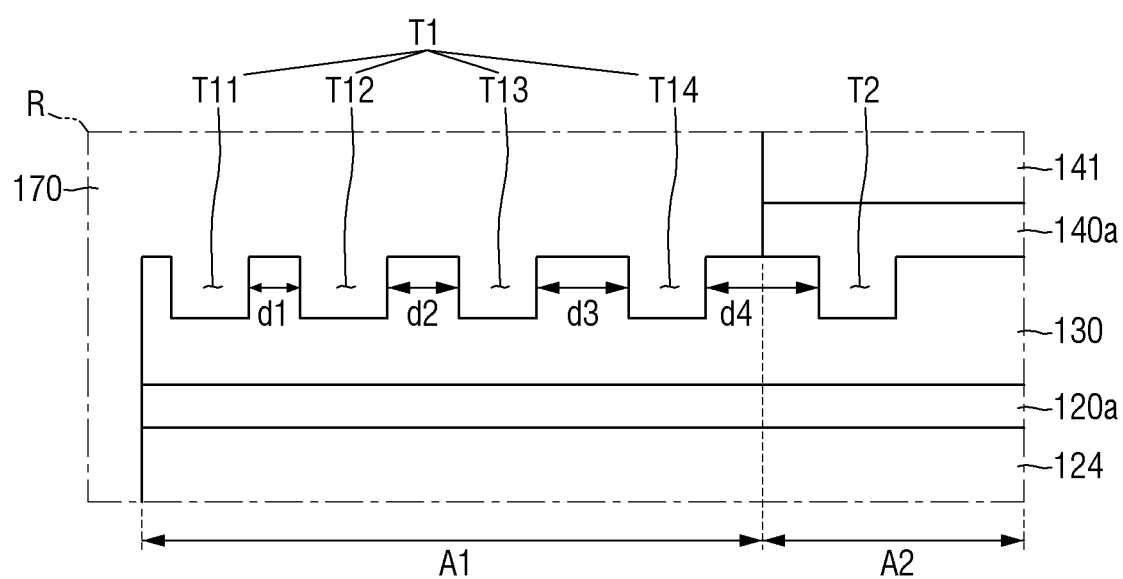
FIGS. 4 to 6 are diagrams explaining the semiconductor package according to some embodiments of the present disclosure, and are diagrams corresponding to FIG. 3.
Figure 5:
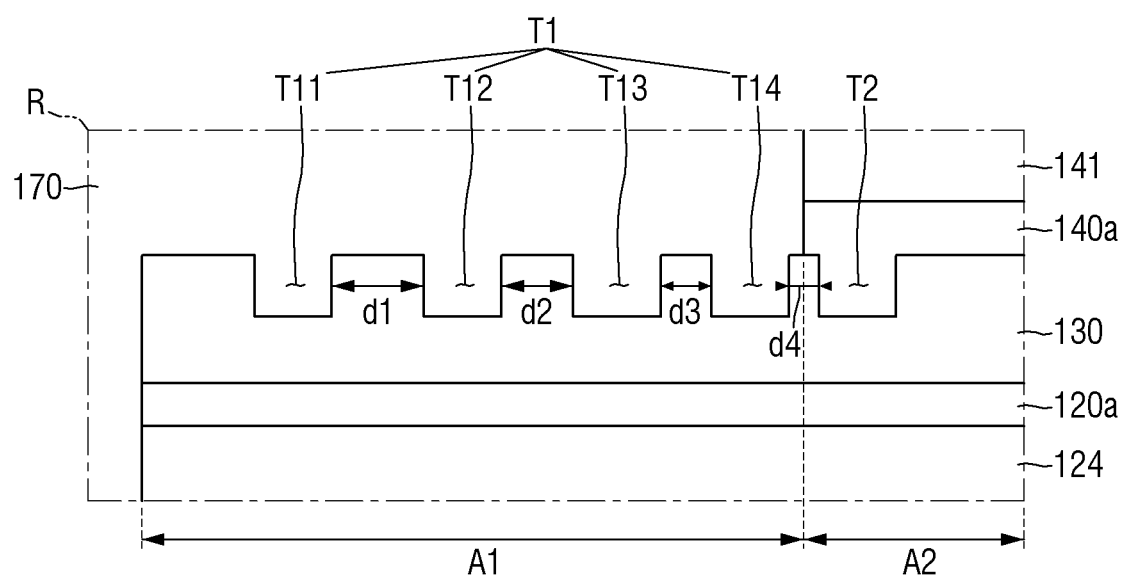
Figure 6:
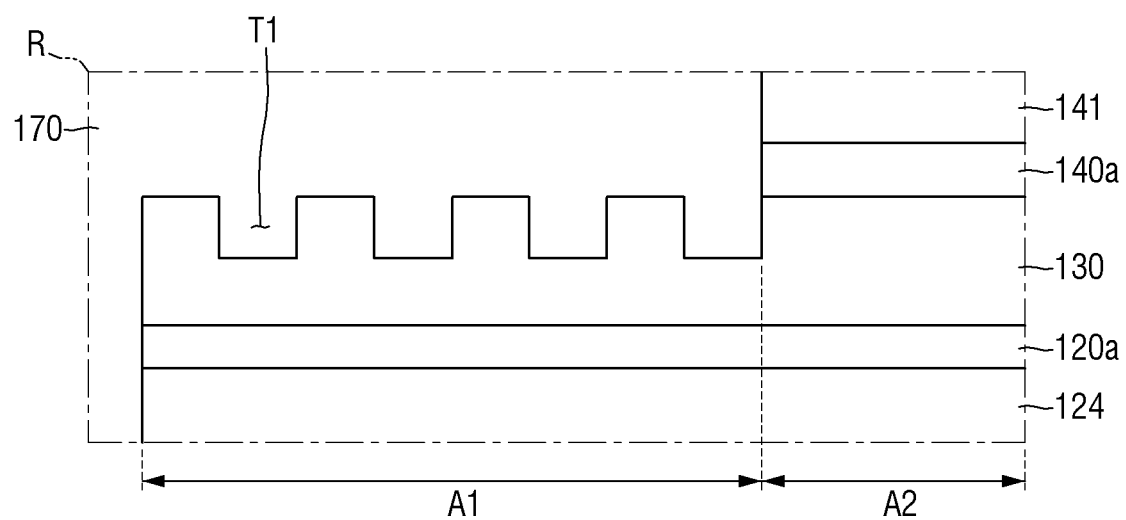
Figure 7:
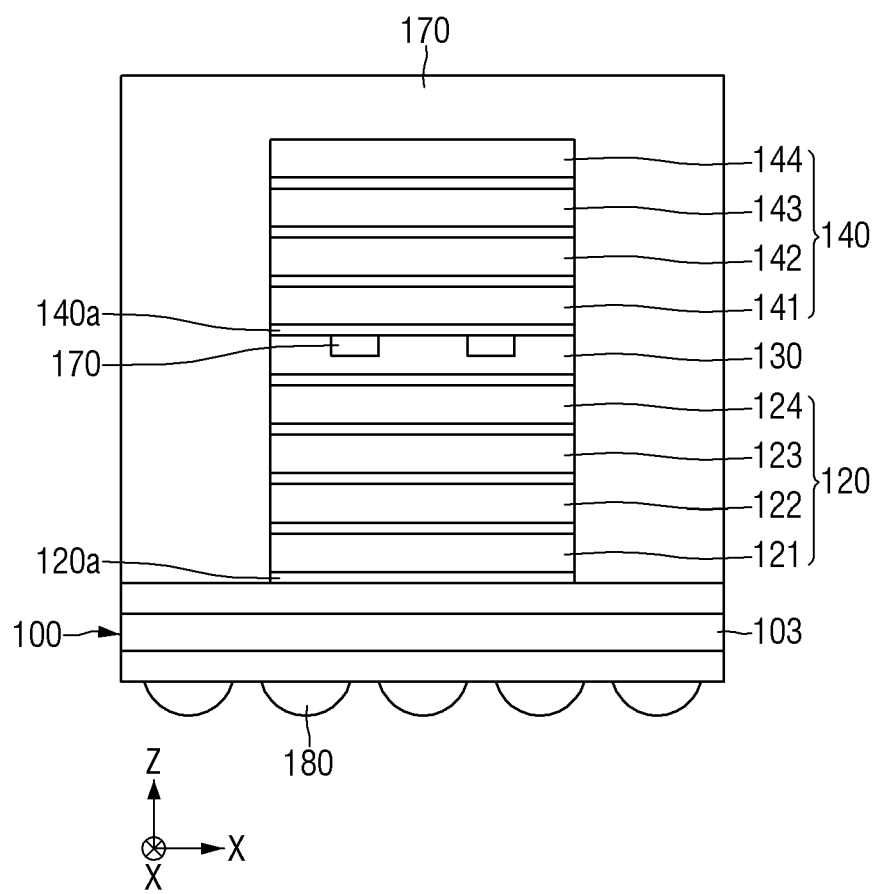
FIG. 7 is a cross-sectional view taken along line II-IP in FIG. 1.

FIG. 1 is a top plan view illustrating a semiconductor package according to some embodiments of the present disclosure. FIG. 2 is a cross-sectional view taken along line I-I' in FIG. 1. FIG. 3 is an enlarged diagram of a region R in FIG. 2. FIGS. 4 to 6 are diagrams explaining the semiconductor package according to some embodiments of the present disclosure, and are diagrams corresponding to FIG. 3. FIG. 7 is a cross-sectional view taken along line II-IP in FIG. 1. For the convenience of description, in FIGS. 3 to 6, descriptions of a first semiconductor chip pad 151 and a first connection unit 150 may be omitted.

First, referring to FIGS. 1 and 2, a semiconductor package 1000A according to some embodiments of the present disclosure includes a substrate 100, a plurality of first semiconductor chip stacks 120_1 and 120_2, a second semiconductor chip stack 140, a spacer 130, and a mold layer 170.

The substrate 100 may be a substrate for a semiconductor package. The substrate 100 may be, for example, a printed circuit board (PCB), a lead frame (LF), a ceramic substrate, a silicon wafer, or a wiring substrate. The printed circuit board may include a rigid printed circuit board (Rigid PCB), a flexible printed circuit board (Flexible PCB), or a rigid flexible circuit board (Rigid Flexible PCB).

Referring to FIG. 1, the substrate 100 may extend in a first direction X and a second direction Y, respectively. The first direction X and the second direction Y may be a direction parallel to an upper surface of the substrate 100 and a direction intersecting each other, respectively.

The substrate 100 may include a core 103, a lower solder resist layer 101, and an upper solder resist layer 102. A wiring pad 110 may be formed in the substrate 100. The wiring pad 110 may include a first upper pad 112_1, a second upper pad 112_2, and a lower pad 111.

The lower solder resist layer 101 and the upper solder resist layer 102 may expose at least part of the first upper pad 112_1, the second upper pad 112_2 and the lower pad 111.

The upper solder resist layer 102 may be disposed on the core 103. The upper solder resist layer 102 may cover at least part of the first upper pad 112_1 and the second upper pad 112_2.

The first upper pad 112_1 may serve to electrically connect a first-first semiconductor chip stack 120_1 and the substrate 100. For example, the first upper pad 112_1 may be connected to the first-first semiconductor chip stack 120_1 disposed on the substrate 100 via the first connection unit 150. For example, the first connection unit 150 may be a bonding wire.

The second upper pad 112_2 may serve to electrically connect the second semiconductor chip stack 140 and the substrate 100. For example, the second upper pad 112_2 may be connected to the second semiconductor chip stack 140 disposed on the substrate 100 via a second connection unit 160. For example, the second connection unit 160 may be a bonding wire.

The lower solder resist layer 101 may be disposed under the core 103. The lower solder resist layer 101 may cover at least part of the lower pad 111.

The lower pad 111 may be disposed under the core 103. The lower pad 111 may be electrically connected to an external terminal 180. The lower pad 111 may serve to electrically connect the external terminal 180 and the substrate 100.

In the drawings, although it is illustrated that the first upper pad 112_1, the second upper pad 112_2 and the lower pad 111 are formed in a predetermined number, the present disclosure is not limited thereto. For example, a plurality of first upper pads 112_1, second upper pads 112_2 and lower pads 111 may be formed as necessary.

The lower solder resist layer 101 and the upper solder resist layer 102 may include an organic material such as a photosensitive polymer. The photosensitive polymer may include, for example, at least one of a photosensitive polyimide, a polybenzooxazole, a phenol-based polymer, and a benzocyclobutene-based polymer. The lower solder resist layer 101 and the upper solder resist layer 102 may include, for example, a photo imageable dielectric (PID), but are not limited thereto.

The first upper pad 112_1, the second upper pad 112_2 and the lower pad 111 may include a conductive material. The first upper pad 112_1, the second upper pad 112_2 and the lower pad 111 may include, for example, gold (Au), silver (Ag), copper (Cu), nickel (Ni), or aluminum (Al).

A plurality of external terminals 180 may be formed under the substrate 100. The external terminal 180 may be disposed to be electrically connected to the substrate 100. The external terminal 180 may be electrically connected to, for example, the lower pad 111. The external terminal 180 may be in contact with, for example, the lower pad 111.

The external terminal 180 may electrically connect the semiconductor package including the substrate 100 to other semiconductor packages. Alternatively, the external terminal 180 may electrically connect the semiconductor package including the substrate 100 to other semiconductor devices.

In the drawings, the external terminal 180 is illustrated as a solder ball, but the present disclosure is not limited thereto. For example, the external terminal 180 may be a solder bump, a grid array, or a conductive tab.

The semiconductor chip stack may be disposed on the substrate 100. The semiconductor chip stack may include a first semiconductor chip stack 120 and the second semiconductor chip stack 140 disposed on the first semiconductor chip stack 120.

Referring to FIG. 1, the first semiconductor chip stack 120 may include the first-first semiconductor chip stack 120_1 and a first-second semiconductor chip stack 120_2 spaced apart from each other in the second direction Y. The second semiconductor chip stack 140 may be disposed on the first-first semiconductor chip stack 120_1 and the first-second semiconductor chip stack 120_2 to form a dolmen structure. Although not illustrated in detail, a description of the first-first semiconductor chip stack 120_1 may also be similarly applied to the first-second semiconductor chip stack 120_2 hereinafter.

The first-first semiconductor chip stack 120_1 may be formed on the substrate 100. The first-first semiconductor chip stack 120_1 may include first to fourth semiconductor chips 121 to 124. The first-first semiconductor chip stack 120_1 may have a form in which a plurality of semiconductor chips (for example, 121 to 124) are stacked in a third direction Z intersecting each of the first and second directions X and Y. For example, with respect to the first and second directions X and Y in which an upper surface of the substrate 100 extends, the third direction Z may be a direction perpendicular to the first and second directions X and Y.

Each of the semiconductor chips 121 to 124 may include a memory chip. Each of the semiconductor chips 121 to 124 may include a volatile memory chip such as DRAM.

The first semiconductor chip pad 151 may be disposed on upper surfaces of each of the first to fourth semiconductor chips 121 to 124. A plurality of first semiconductor chip pads 151 may be formed. The first semiconductor chip pad 151 may include, for example, at least one metal of copper (Cu), aluminum (Al), tungsten (W), and titanium (Ti). The first connection unit 150 may be connected to the first semiconductor chip pad 151 and the first upper pad 112_1.

A first adhesive layer 120a may be disposed between each of the semiconductor chips 121 to 124, between a lowermost semiconductor chip 121 and the substrate 100, and between the spacer 130 and an uppermost semiconductor chip 124, as will be described below.

The first adhesive layer 120a may be, for example, a direct adhesive film (DAF) or a film over wire (FOW). The first adhesive layer 120a may include an insulating polymer. For example, the first adhesive layer 120a may include an epoxy-based resin and filler.

The filler may include at least one selected from the group consisting of silica ($SiO_2$), alumina ($Al_2O_3$), silicon carbide (SiC), barium sulfate ($BaSO_4$), talc, mud, mica powder, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanic acid ($BaTiO_3$), and zirconate ($CaZrO_3$). However, the material of the filler is not limited thereto, and the filler may include a metal material and/or an organic material.

The first adhesive layer 120a may serve to insulate one of each of the semiconductor chips 121 to 124 from the other. In addition, the first adhesive layer 120a may serve to insulate, for example, the substrate 100 from one of each of the semiconductor chips 121 to 124.

Although not illustrated in detail, a controller may be provided on the substrate 100. The controller may be horizontally spaced apart from the first-first and first-second semiconductor chip stacks 120_1 and 120_2 (e.g., in a direction parallel to the upper surface of the substrate 100). The controller may be, for example, a logic chip configured to control a memory chip.

Sidewalls of the first to fourth semiconductor chips 121 to 124 included in the first-first semiconductor chip stack 120_1 may be aligned with each other, as illustrated in FIG. 2. For example, the sidewall of one of the first to fourth semiconductor chips 121 to 124 may be disposed on the same line as the sidewall of the other 122 in the third direction Z.

In addition to what is illustrated in the drawings, the first semiconductor chip pad 151 may have a shape protruding in the shape of the first to fourth semiconductor chips 121 to 124. However, the present disclosure is not limited thereto, and for example, a via may be formed instead of the first semiconductor chip pad 151. In this case, the first to fourth semiconductor chips 121 to 124 may be electrically connected to the substrate 100 through the via.

The second semiconductor chip stack 140 may be formed on the first-first semiconductor chip stack 120_1. The second semiconductor chip stack 140 may include first to fourth semiconductor chips 141 to 144 stacked in the third direction Z.

Each of the semiconductor chips 141 to 144 may include a memory chip. Each of the semiconductor chips 141 to 144 may include a non-volatile memory chip such as a NAND flash memory.

The second adhesive layer 140a may be disposed between the semiconductor chips 141 to 144 and between a lowermost semiconductor chip 141 and the spacer 130.

The second adhesive layer 140a may be, for example, a direct adhesive film (DAF) or a film over wire (FOW). The second adhesive layer 140a may include an insulating polymer. The description of the first adhesive layer 120a described above may also be similarly applied to a description of the material of the second adhesive layer 140a.

The second adhesive layer 140a may serve to insulate one of each of the semiconductor chips 141 to 144 from the other. In addition, the second adhesive layer 140a may serve to improve reliability with the first-first semiconductor chip stack 120_1 by firmly attaching the lowermost layer semiconductor chip 141 and the spacer 130.

The first to fourth semiconductor chips 141 to 144 included in the second semiconductor chip stack 140 may be stacked in a stepped configuration, as illustrated in FIG. 2. For example, one semiconductor chip 141 of the second semiconductor chip stack 140 may be stacked in a state in which it is spaced apart from an adjacent semiconductor chip 142 by a predetermined distance in a certain direction. That is, the first to fourth semiconductor chips 141 to 144 included in the second semiconductor chip stack 140 may be sequentially offset-aligned, as illustrated. The certain direction may be, for example, the first direction X and/or the second direction Y.

As the first to fourth semiconductor chips 141 to 144 included in the second semiconductor chip stack 140 are stacked in a stepped shape (i.e., not in alignment along the Z direction), a second semiconductor chip pad 161 formed on the upper surfaces of each of the first to fourth semiconductor chips 141 to 144 may be exposed, as illustrated in FIG. 2. In other words, the second semiconductor chip stack 140 may have a stepped structure that descends along the first direction X.

The second semiconductor chip stack 140 and the first-first semiconductor chip stack 120_1 may not be aligned with each other based on the third direction Z. In other words, the second semiconductor chip stack 140 and the first-first semiconductor chip stack 120_1 may be disposed to cross each other. It means the second semiconductor chip stack 140 extends along the second direction Y and the first-first semiconductor chip stack 120_1 extends along the first direction X.

The second semiconductor chip pad 161 may be exposed on one side edge (e.g., a right edge) of the upper surfaces of each of the first to fourth semiconductor chips 141 to 144, as illustrated in FIG. 2. A plurality of second semiconductor chip pads 161 may be formed. The second semiconductor chip pad 161 may include, for example, at least one metal of copper (Cu), aluminum (Al), tungsten (W) and titanium (Ti). The second connection unit 160 may be connected to the second semiconductor chip pad 161 and the second upper pad 112_2.

In addition to what is illustrated in in FIG. 2, the second semiconductor chip pad 161 may have a shape protruding in the shape of the first to fourth semiconductor chips 141 to 144. However, the present disclosure is not limited thereto, and for example, the via may be formed instead of the second semiconductor chip pad 161. In this case, the first to fourth semiconductor chips 141 to 144 may be electrically connected to the substrate 100 using the via.

The spacer 130 may be disposed on the first-first semiconductor chip stack 120_1. The spacer 130 may be disposed on the first adhesive layer 120a on the uppermost semiconductor chip 124. The spacer 130 may include silicon (Si).

Referring to FIG. 3, the spacer 130 may include a first region A1 and a second region A2 on the first-first semiconductor chip stack 120_1. The first region A1 may be a region in which the mold layer 170, which is described below, is formed, and the second region A2 may be a region in which the second semiconductor chip stack 140 is formed.

The second region A2 may be a region overlapping the second semiconductor chip stack 140 in the third direction Z.

The spacer 130 may include a first trench T1 disposed in the first region A1 on the first-first semiconductor chip stack 120_1 and a second trench T2 disposed in the second region A2 on the first-first semiconductor chip stack 120_1.

The first trench T1 may be formed on an upper surface of the first-first semiconductor chip stack 120_1 exposed by disposing the second semiconductor chip stack 140 and the first-first semiconductor chip stack 120_1 to cross each other.

The first and/or second trenches T1 and T2 may extend in the first direction X and/or the second direction Y along a plurality of first and second dicing lines DX and DY (FIG. 1) formed on an upper surface of the uppermost semiconductor chip of each of the first-first semiconductor chip stack 120_1 and the first-second semiconductor chip stack 120_2.

Referring to FIGS. 1 to 6, a plurality of first and/or second trenches T1 and T2 may be formed along the plurality of second dicing lines DY extending in the second direction Y.

Referring to FIGS. 1 and 7, a plurality of first trenches T1 may be formed along the plurality of first dicing lines DX extending in the first direction X. Although not illustrated in detail, a plurality of second trenches T2 may be formed along the plurality of second dicing lines DX extending in the first direction X In the drawings, the positions and numbers of the first and second dicing lines DX and DY are illustrated, but the present disclosure is not limited thereto. In other words, the positions and numbers of the first and second dicing lines DX and DY may be variously formed and are not limited to what is illustrated.

Referring to FIG. 3, the plurality of first trenches T1 may be disposed in the first region A1 in which the second semiconductor chip stack 140 is not disposed among regions on the first-first semiconductor chip stack 120_1. The second trench T2 may be disposed in the second region A2 in which the second semiconductor chip stack 140 is disposed among the regions on the first-first semiconductor chip stack 120_1.

In this case, the inside of the first trench T1 may be filled with the mold layer 170. The first trench T1 may be in direct contact with the mold layer 170. In this case, a gap between the second semiconductor chip stack 140 and the second trench T2 may be filled with the second adhesive layer 140a. The second trench T2 may be in direct contact with the second adhesive layer 140a.

Due to the first and/or second trenches T1 and T2, a concavo-convex structure may be formed in the spacer 130. With the concavo-convex structure, a contact area between the mold layer 170 and the semiconductor package and between the second adhesive layer 140a and the semiconductor package may be increased. As a result, product reliability may be improved in the semiconductor package in which a plurality of semiconductor chip stacks are stacked.

A plurality of first and/or second trenches T1 and T2 may be formed. For example, a gap or distance between the first and/or second trenches T1 and T2 may be constant. In this case, a distance between the first and/or second dicing lines DX and DY may be constant. However, the technical idea of the present disclosure is not limited thereto, and the gap between the first and/or second trenches T1 and T2 and the distance between the first and/or second dicing lines DX and DY may not be constant as described below.

Although a specific number of first and second trenches T1 and T2 are illustrated in the drawings, the number of first and second trenches T1 and T2 is not limited thereto.

The mold layer 170 may integrally cover the first-first semiconductor chip stack 120_1 and the second semiconductor chip stack 140 and the spacer 130.

The mold layer 170 may include an insulating material. For example, the mold layer 170 may include a thermosetting resin such as an epoxy resin and a thermoplastic resin such as polyimide. In addition, for example, the mold layer 170 may include a known molding material such as an epoxy molding compound (EMC).

Between the first-first semiconductor chip stack 120_1 and the second semiconductor chip stack 140 disposed to cross each other, the mold layer 170 may be disposed on a region in which the second semiconductor chip stack 140 is not disposed among regions on the first-first semiconductor chip stack 120_1. As a result, an interface peeling phenomenon between a lower chip stack and an EMC layer may be minimized in a region between the lower chip stack and an upper chip stack.

Referring to FIG. 4, the gap or distance between the first and/or second trenches T1 and T2 may be maximum in the second region A2 adjacent to the second semiconductor chip stack 140. The distance between the first and/or second trenches T1 and T2 may increase as it approaches (i.e., in a direction toward) the second semiconductor chip stack 140. In this case, the distance between the plurality of first trenches T1 may not be constant.

Specifically, a distance d1 between a first-first trench T11 and an adjacent first-second trench T12 may be less than a distance d2 between the first-second trench T12 and an adjacent first-third trench T13. The distance d2 between the first-second trench T12 and the adjacent first-third trench T13 may be less than a distance d3 between the first-third trench T13 and an adjacent first-fourth trench T14. The distance d3 between the first-third trench T13 and the adjacent first-fourth trench T14 may be less than a distance d4 between the first-fourth trench T14 and the adjacent second trench T2.

Referring to FIG. 5, the gap or distance between the first and/or second trenches T1 and T2 may be minimum in the second region A2 adjacent to the second semiconductor chip stack 140. The distance between the first and/or second trenches T1 and T2 may decrease as it approaches (i.e., in a direction toward) the second semiconductor chip stack 140. In this case, the distance between adjacent ones of the plurality of first trenches T1 may not be constant.

Specifically, the distance d1 between the first-first trench T11 and the adjacent first-second trench T12 may be greater than the distance d2 between the first-second trench T12 and the adjacent first-third trench T13. The distance d2 between the first-second trench T12 and the adjacent first-third trench T13 may be greater than the distance d3 between the first-third trench T13 and the adjacent first-fourth trench T14. The distance d3 between the first-third trench T13 and the adjacent first-fourth trench T14 may be greater than the distance d4 between the first-fourth trench T14 and the adjacent second trench T2.

In FIGS. 4 and 5, it is illustrated that the gap or distance between the first and/or the second trenches T1 and T2 increases or decreases as it approaches (i.e., in the direction toward) a certain region, but the technical idea of the present disclosure is not limited thereto. In other words, the gap or distance between the first and/or second trenches T1 and T2 may be non-uniform.

Referring to FIG. 6, a second trench T2 may not be formed. The spacer 130 may include only the first trench T1 disposed in the first region A1 on the first-first semiconductor chip stack 120_1. In other words, a trench may not be formed in a region of the spacer 130 in which the second semiconductor chip stack 140 is disposed.

FIGS. 8 to 11 are diagrams illustrating the semiconductor package according to some embodiments of the present disclosure. For convenience, descriptions of the same contents as those described using FIGS. 1 to 7 may be omitted.

Figure 8:
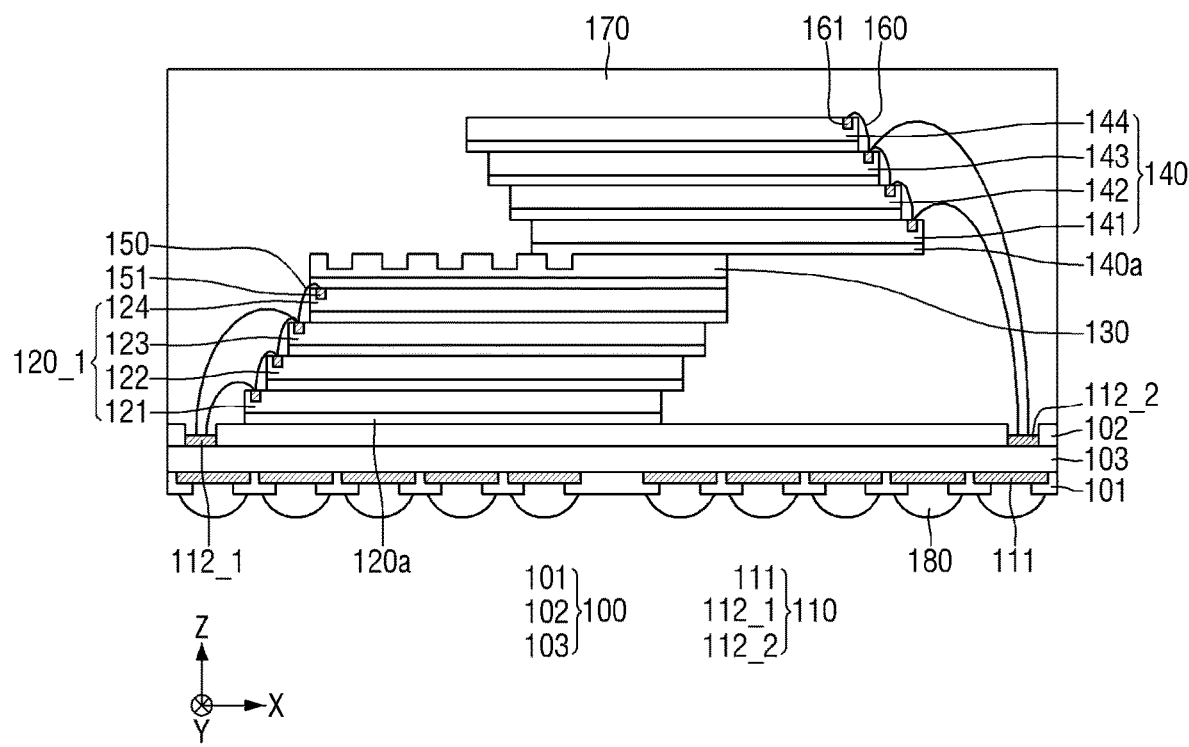
FIGS. 8 to 11 are diagrams explaining the semiconductor package according to some embodiments of the present disclosure.

Referring to FIG. 8, the first to fourth semiconductor chips 121 to 124 included in the first-first semiconductor chip stack 120_1 may be stacked in a stepped shape. For example, one semiconductor chip 121 of the first-first semiconductor chip stacks 120_1 may be stacked in a state in which it is spaced apart from the an adjacent semiconductor chip 122 thereof by a predetermined distance in a certain direction. In other words, the first to fourth semiconductor chips 121 to 124 included in the first-first semiconductor chip stack 120_1 may be sequentially offset-aligned. The certain direction may be, for example, the first direction X and/or the second direction Y.

As the first to fourth semiconductor chips 121 to 124 included in the first-first semiconductor chip stack 120_1 are stacked in a stepped manner, the first semiconductor chip pads 151 formed on the upper surfaces of each of the first to fourth semiconductor chips 121 to 124 may be exposed on the other side edge (for example, a left edge) of the upper surfaces of each of the first to fourth semiconductor chips 121 to 124. The first-first semiconductor chip stack 120_1 may have a stepped structure that ascends along the first direction X.

Figure 9:
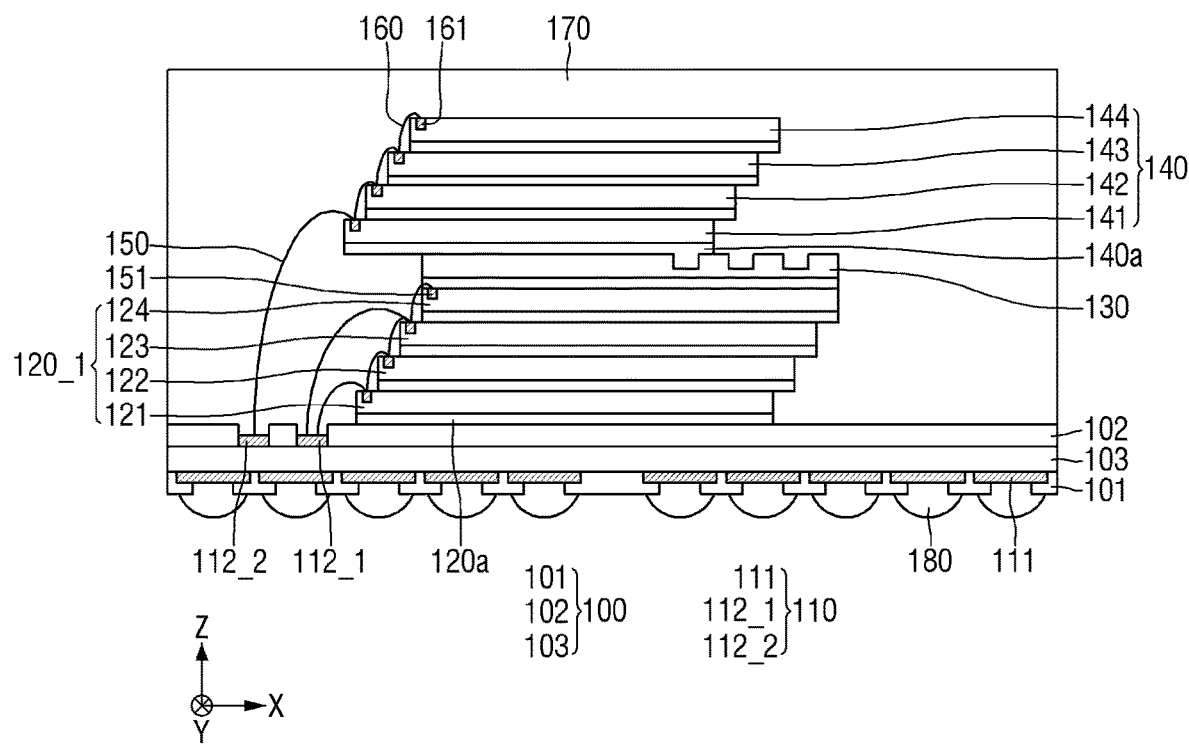

Referring to FIG. 9, as the first to fourth semiconductor chips 141 to 144 included in the second semiconductor chip stack 140 are stacked in a stepped shape, the second semiconductor chip pad 161 formed on the upper surfaces of each of the first to fourth semiconductor chips 141 to 144 may be exposed on the other side edge (for example, a left edge) of the upper surfaces of each of the first to fourth semiconductor chips 141 to 144. The second semiconductor chip stack 140 may have a stepped structure that ascends along the first direction X.

Figure 10:
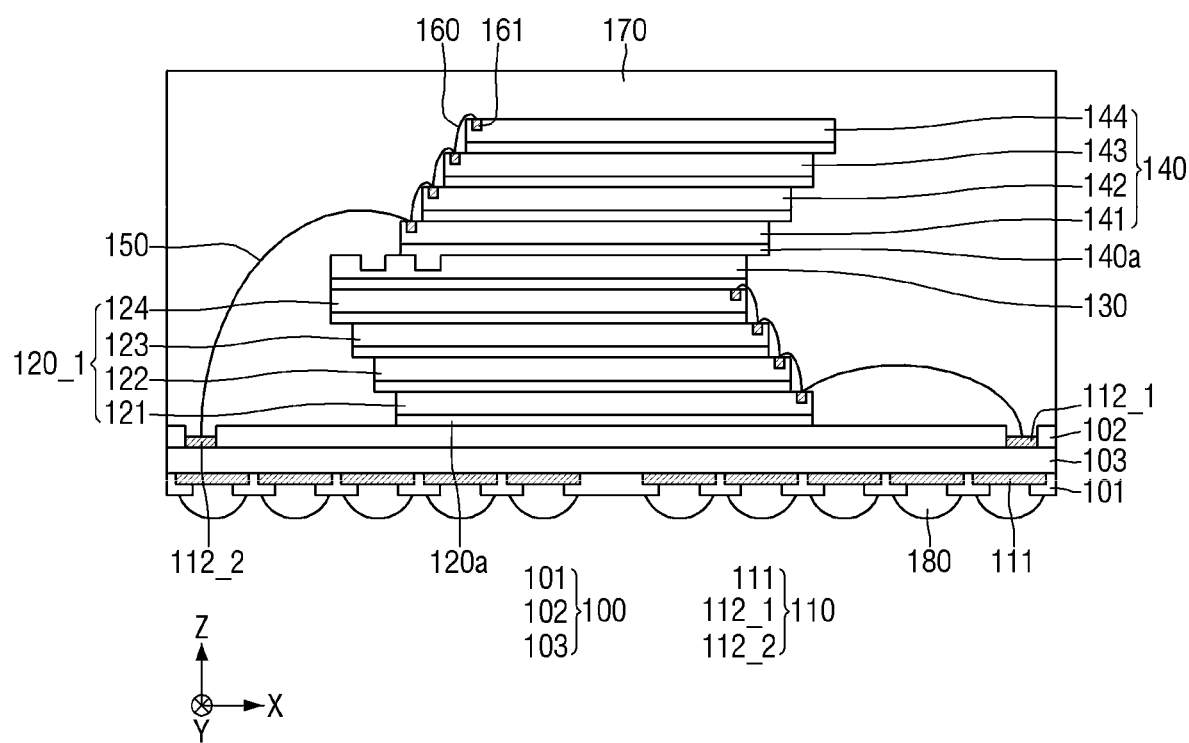

Referring to FIG. 10, as the first to fourth semiconductor chips 121 to 124 included in the first-first semiconductor chip stack 120_1 are stacked in a stepped shape, the first semiconductor chip pad 151 formed on the upper surfaces of each of the first to fourth semiconductor chips 121 to 124 may be exposed on one side side edge (for example, a right edge) of the upper surfaces of each of the first to fourth semiconductor chips 121 to 124. The first-first semiconductor chip stack 120_1 may have a stepped structure that descends along the first direction X.

As the first to fourth semiconductor chips 141 to 144 included in the second semiconductor chip stack 140 are stacked in a stepped manner, the second semiconductor chip pad 161 formed on the upper surfaces of each of the first to fourth semiconductor chips 141 to 144 may be exposed on the other side edge (for example, a left edge) of the upper surfaces of each of the first to fourth semiconductor chips 141 to 144. The second semiconductor chip stack 140 may have a stepped structure that ascends along the first direction X.

Figure 11:
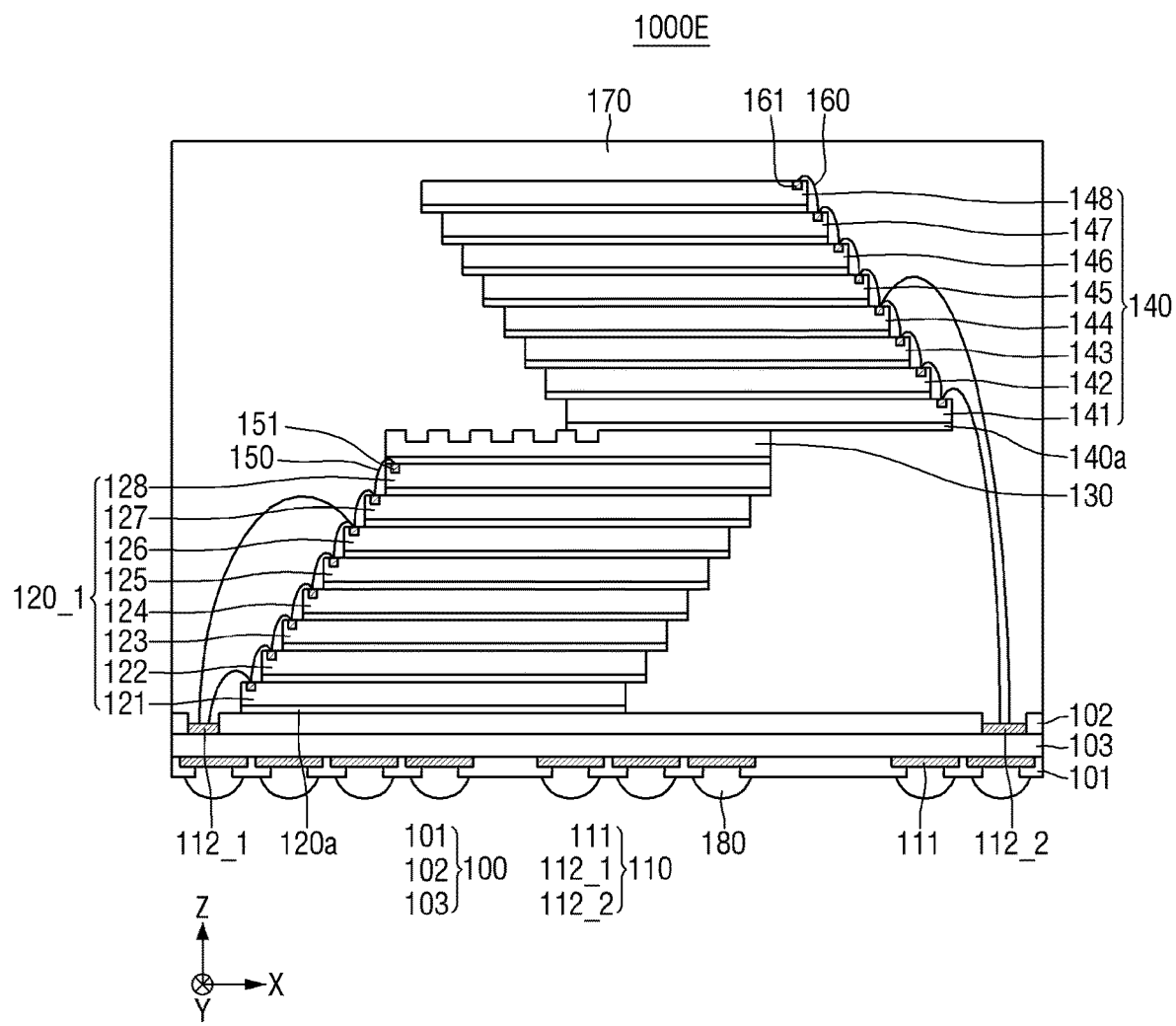

Referring to FIG. 11, the first-first semiconductor chip stack 120_1 further includes fourth to eighth semiconductor chips 125 to 128 on the first to fourth semiconductor chips 121 to 124. The second semiconductor chip stack 140 further includes fourth to eighth semiconductor chips 145 to 148 on the first to fourth semiconductor chips 141 to 144.

The fourth to eighth semiconductor chips 125 to 128 may be stacked in a stepped shape (i.e., a stepped shape facing a center region of the substrate 100) in which the plurality of semiconductor chips ascends in the first direction X. The first semiconductor chip pad 151 of the fourth to eighth semiconductor chips 125 to 128 is electrically connected to the substrate 100 via the first connection unit 150. The first connection unit 150 may be disposed in an outer region of the first-first semiconductor chip stack 120_1.

The fourth to eighth semiconductor chips 145 to 148 may be stacked in a stepped shape (i.e., a stepped shape facing an edge region of the substrate 100) in which the plurality of semiconductor chips descend in the first direction X. The second semiconductor chip pad 161 of the fourth to eighth semiconductor chips 145 to 148 is electrically connected to the substrate 100 via the second connection unit 160. The second connection unit 160 may be disposed in an outer region of the second semiconductor chip stack 140.

FIGS. 12 to 15 are intermediate step diagrams explaining a method of fabricating the semiconductor package according to some embodiments of the present disclosure. FIG. 16 is a flowchart illustrating the method of fabricating the semiconductor package according to some embodiments of the present disclosure. For convenience, descriptions of the same contents as those described using FIGS. 1 to 7 may be omitted. In addition, for convenience, descriptions of the first and second connection units 150 and 160 may be omitted.

Figure 12:
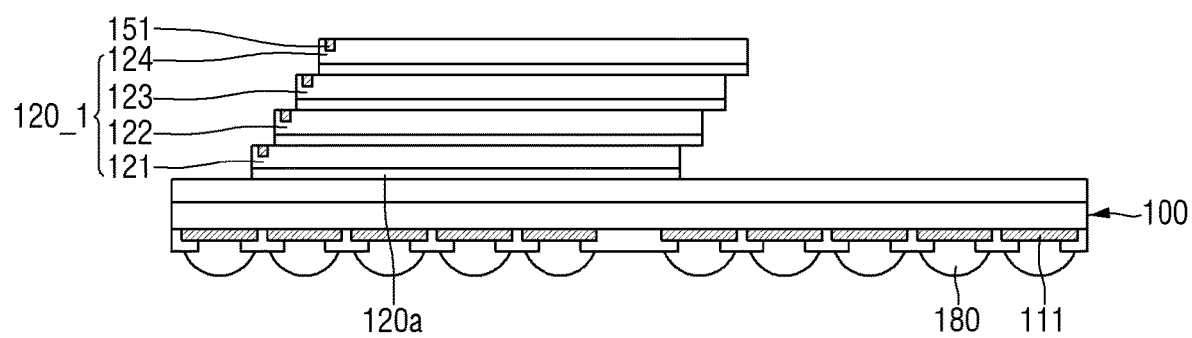
FIGS. 12 to 15 are intermediate step diagrams explaining a method of fabricating the semiconductor package according to some embodiments of the present disclosure.

Referring to FIGS. 12 and 16, the first-first semiconductor chip stack 120_1 is formed on the substrate 100 in which the lower pad 111 and the external terminal 180 are formed (S100).

Figure 13:
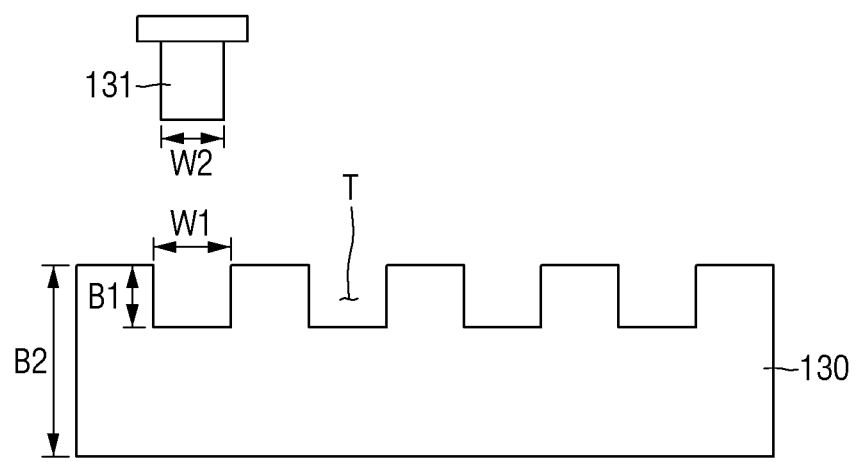
Figure 14:
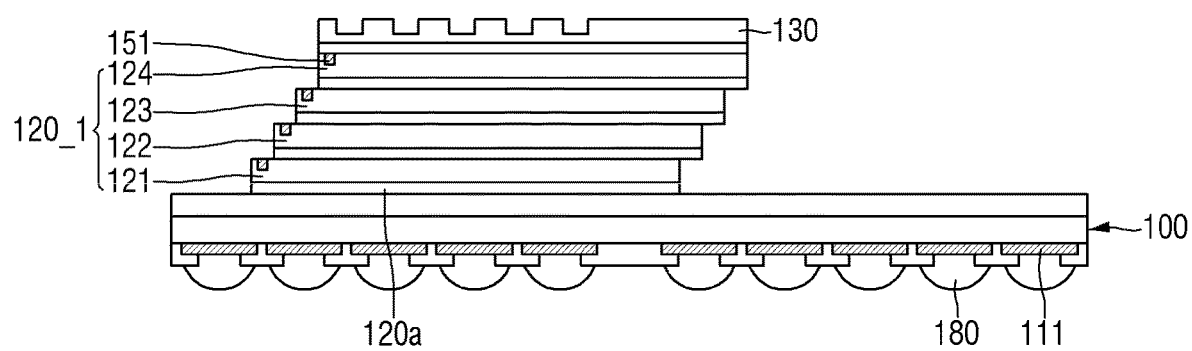

Referring to FIGS. 13 to 14 and 16, the spacer 130 in which a trench T is formed on the first-first semiconductor chip stack 120_1 is formed (S200). The trench T may mean at least one of the first and second trenches T1 and T2 described above. The trench T may extend in at least one of the first and second directions X and Y.

Referring to FIG. 13, the spacer 130 having the trench T formed therein may be formed by removing part of the spacer 130 by half-cutting. The half-cutting of the spacer 130 may be performed by removing only part of the spacer 130 along the third direction Z. In this case, part of the spacer 130 may be removed using a cutting blade 131 or a laser.

In this case, a depth B1 of the trench T may be less than a thickness B2 of the spacer 130 with respect to the third direction Z. Furthermore, with respect to the first direction X or the second direction Y, a width W1 of the trench T may be equal to or greater than a width W2 of the cutting blade 131.

The trench T may be formed along a first dicing line DX extending in the first direction X in FIG. 1, and may be formed along a second dicing line DY extending in the second direction Y. Alternatively, unlike FIG. 1, the first dicing line DX may not be formed, but only the second dicing line DY may be formed. Alternatively, unlike FIG. 1, the second dicing line DY may not be formed, but only the first dicing line DX may be formed.

A gap between the dicing lines may vary for each region of the spacer. That is, the gap between the first and second dicing lines DX and DY may be made closer or farther from the region adjacent to the second semiconductor chip stack 140 among the regions of the spacer 130. However, the technical idea of the present disclosure is not limited thereto. The gap between the dicing lines may be variously formed according to characteristics of a desired semiconductor package, or may be formed to be constant or non-constant.

Figure 15:
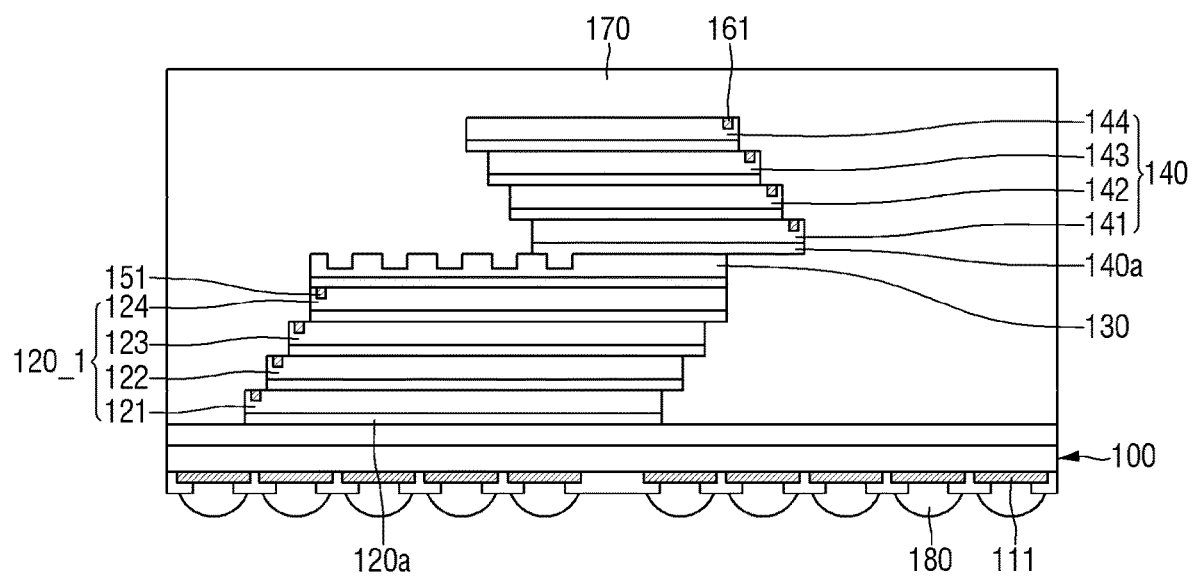
Figure 16:
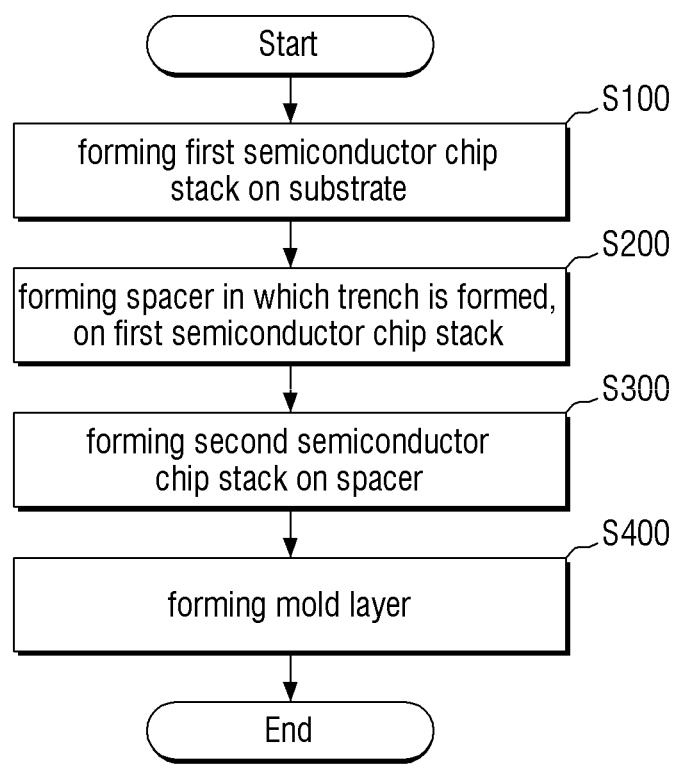
FIG. 16 is a flowchart explaining the method of fabricating the semiconductor package according to some embodiments of the present disclosure.

Referring to FIGS. 15 and 16, the second semiconductor chip stack 140 is formed on the spacer 130 in which the trench T is formed (S300).

The mold layer 170 integrally covering the first-first semiconductor chip stack 120_1, the second semiconductor chip stack 140 and the spacer 130 is formed (S400). At least part of the trench T may be filled with the mold layer 170. At least another part of the trench T may be filled with the second adhesive layer 140a.

The substrate 100 and the first-first semiconductor chip stack 120_1 may be electrically connected via the first connection unit 150, and the substrate 100 and the second semiconductor chip stack 140 may be electrically connected via the second connection unit 160 to form the semiconductor package.

Accordingly, for example, the semiconductor package illustrated in FIG. 8 may be formed.

Figure 17:
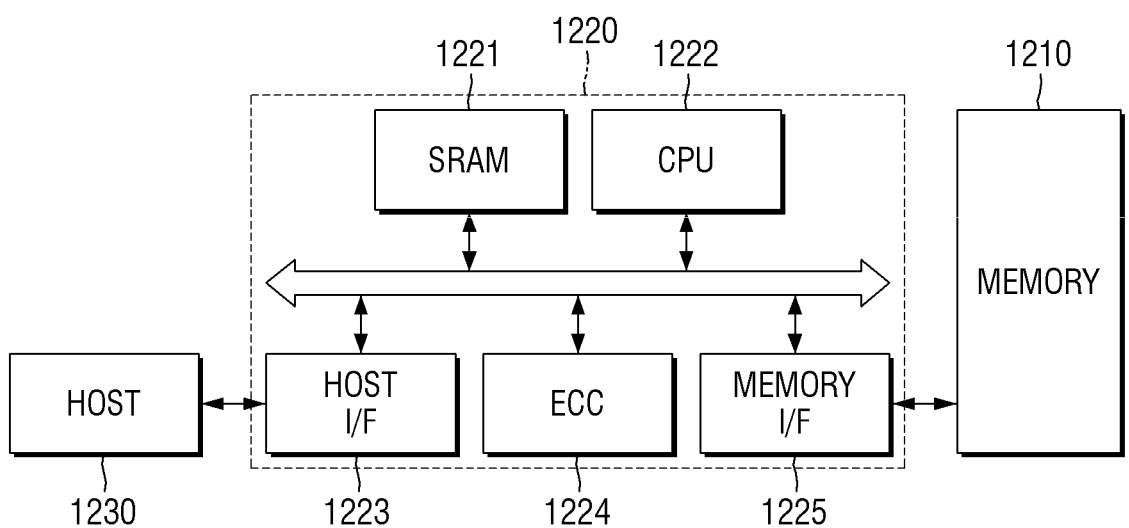
FIG. 17 is a block diagram illustrating a memory card with the semiconductor package according to some embodiments of the present disclosure.

FIG. 17 is a block diagram illustrating a memory card with a semiconductor package according to some embodiments of the present disclosure.

Referring to FIG. 17, semiconductor packages 1000A to 1000E according to some embodiments of the present disclosure may be applied to a memory card 1200.

The memory card 1200 may include a memory controller 1220 configured to control data exchange between a host 1230 and a memory 1210. An SRAM 1221 may be used as an operating memory of a central processing device 1222. A host interface 1223 may include a data exchange protocol of the host 1230 connected to the memory card 1200. An error correction code (ECC) 1224 may detect and correct an error included in data read from the memory 1210. A memory interface 1225 may interface with the memory 1210. The central processing unit (CPU) 1222 may perform an overall control operation for data exchange of the memory controller 1220.

For example, at least one of the memory 1210 and the central processing unit 1222 may include at least one of the semiconductor packages 1000A to 1000E according to some embodiments of the present disclosure.

Figure 18:
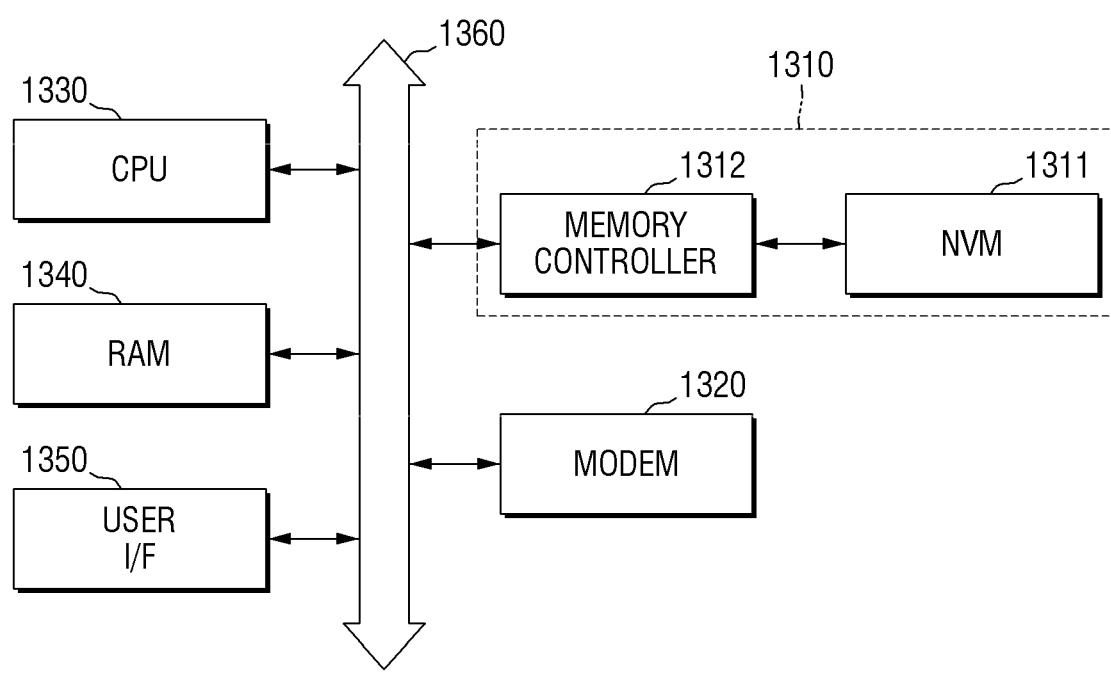
FIG. 18 is a block diagram illustrating an information processing system to which the semiconductor package is applied according to some embodiments of the present disclosure.

FIG. 18 is a block diagram illustrating an information processing system to which the semiconductor package is applied according to some embodiments of the present disclosure Referring to FIG. 18, the semiconductor packages 1000A to 1000E according to embodiments of the present disclosure may be applied to an information processing system 1300.

The information processing system 1300 may include a mobile device, a computer, or the like. The information processing system 1300 may include a memory system 1310 electrically connected to a system bus 1360, a modem 1320, a central processing unit (CPU) 1330, a random access memory (RAM) 1340, and a user interface 1350. The memory system 1310 includes a memory 1311 and a memory controller 1312, and may be configured in substantially the same manner as the memory card 1200 in FIG. 17. In addition, at least one of the central processing unit 1330 and the RAM 1340 may include at least one of the semiconductor packages 1000A to 1000E according to some embodiments of the present disclosure.

Data processed by the central processing unit 1330 or data input from the outside may be stored in the memory system 1310. The information processing system 1300 may be provided as a memory card, a solid-state disk, a camera image sensor, and other application chipsets. For example, the memory system 1310 may be configured as a semiconductor disk device (SSD), and in this case, the information processing system 1300 may stably and reliably store a large amount of data in the memory system 1310.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

What is claimed is:

1. A semiconductor package comprising:
a substrate;
a plurality of first semiconductor chips on the substrate and spaced apart from each other in a first direction;
a plurality of second semiconductor chips on the plurality of first semiconductor chips;
a spacer between an uppermost one of the plurality of first semiconductor chips and a lowermost one of the plurality of second semiconductor chips, the spacer comprising a plurality of trenches extending in the first direction; and
a mold layer within the plurality of trenches.

2. The semiconductor package of claim 1, wherein the mold layer is on the plurality of first semiconductor chips, the plurality of second semiconductor chips, and the spacer.

3. The semiconductor package of claim 1, wherein a distance between adjacent ones of the plurality of trenches increases in a direction toward the plurality of second semiconductor chips.

4. The semiconductor package of claim 1, wherein a distance between adjacent ones of the plurality of trenches decreases in a direction toward the plurality of second semiconductor chips.

5. The semiconductor package of claim 1, wherein a distance between adjacent ones of the plurality of trenches is constant.

6. The semiconductor package of claim 1, wherein a distance between adjacent ones of the plurality of trenches is non-constant.

7. The semiconductor package of claim 1, wherein the plurality of trenches are spaced apart from each other along a second direction that is transverse to the first direction.

8. The semiconductor package of claim 1, wherein the plurality of first semiconductor chips and the plurality of second semiconductor chips are offset relative to each other, and
a first one of the plurality of trenches is located in a region of the spacer in which the plurality of second semiconductor chips do not overlie.

9. The semiconductor package of claim 8, wherein a second one of the plurality of trenches is located in a region of the spacer in which the plurality of second semiconductor chips overlie the plurality of first semiconductor chips; and
a gap between the plurality of second semiconductor chips and the second one of the plurality of trenches contains an adhesive layer.

10. A semiconductor package comprising:
a substrate;
a plurality of first semiconductor chip stacks on the substrate and spaced apart from each other in a first direction;
a second semiconductor chip stack on the plurality of first semiconductor chip stacks;

a spacer between the plurality of first semiconductor chip stacks and the second semiconductor chip stack, the spacer comprising a trench; and a mold layer on the plurality of first semiconductor chip stacks, the second semiconductor chip stack, and the spacer, wherein the trench comprises a first trench and a second trench.

11. The semiconductor package of claim 10, wherein the first trench is in contact with the mold layer, and the second trench is in contact with an adhesive layer between the second semiconductor chip stack and the spacer.

12. The semiconductor package of claim 10, wherein the first trench is formed in a region of the spacer over which the second semiconductor chip stack does not overlie.

13. The semiconductor package of claim 10, wherein a plurality of first trenches extend in a first direction, and a distance between adjacent ones of the plurality of first trenches is greatest in a region adjacent to the second semiconductor chip stack.

14. The semiconductor package of claim 10, wherein a plurality of first trenches extend in the first direction, and a distance between adjacent ones of the plurality of first trenches is smallest in a region adjacent to the second semiconductor chip stack.

15. The semiconductor package of claim 10, wherein a plurality of first trenches extend in a second direction.

16. The semiconductor package of claim 10, wherein each of the plurality of first semiconductor chip stacks comprises a plurality of first semiconductor chips stacked in a stepped configuration, and wherein the second semiconductor chip stack comprises a plurality of second semiconductor chips stacked in a stepped configuration.

17. A method for fabricating a semiconductor package, the method comprising:

forming a plurality of first semiconductor chip stacks on a substrate in a spaced apart arrangement;

stacking a spacer on the plurality of first semiconductor chip stacks;

forming a second semiconductor chip stack on a first region of the spacer;

forming a mold layer on the plurality of first semiconductor chip stacks, the second semiconductor chip stack, and the spacer; and forming a trench in a second region of the spacer, wherein the mold layer is within the trench.

18. The method for fabricating the semiconductor package of claim 17, wherein the trench is formed by removing part of the spacer.

19. The method for fabricating the semiconductor package of claim 17, wherein a first dicing line is formed in the second region and extends along a first direction, wherein a second dicing line is formed in the second region and extends along a second direction transverse to the first direction, and wherein the trench is formed along the first dicing line.

20. The method for fabricating the semiconductor package of claim 17, wherein a first dicing line is formed in the second region and extends along a first direction, wherein a second dicing line is formed in the second region and extends along a second direction transverse to the first direction, and wherein the trench is formed along the second dicing line.

* * * * *